United States Patent [19]
Osinski et al.

[11] Patent Number: 6,014,396
[45] Date of Patent: Jan. 11, 2000

[54] FLARED SEMICONDUCTOR OPTOELECTRONIC DEVICE

[75] Inventors: Julian S. Osinski, Palo Alto; Robert J. Lang, Pleasanton; Mats A. Hagberg, Santa Clara, all of Calif.

[73] Assignee: SDL, Inc., San Jose, Calif.

[21] Appl. No.: 08/924,217

[22] Filed: Sep. 5, 1997

[51] Int. Cl.$^7$ ..................................................... H01S 3/085
[52] U.S. Cl. ................................................. 372/46; 372/45
[58] Field of Search .................................. 372/50, 46, 29, 372/32; 359/344, 337

[56] References Cited

U.S. PATENT DOCUMENTS

| | | | |
|---|---|---|---|
| 5,499,261 | 3/1996 | Welch et al. | 372/50 |
| 5,517,517 | 5/1996 | Liou | 372/50 |
| 5,537,432 | 7/1996 | Mehuys et al. | 372/50 |
| 5,539,571 | 7/1996 | Welch et al. | 359/344 |

*Primary Examiner*—James W. Davie
*Attorney, Agent, or Firm*—W. Douglas Carothers, Jr.

[57] ABSTRACT

As to a first feature, a semiconductor optoelectronic device includes a resonator having an optical cavity between opposite end facets, a larger portion of a length of the resonator cavity comprising a single mode confining region for propagation of light and a smaller portion of a length of the resonator cavity comprising a tapered region for permitting propagation of light with a diverging phase front to a first of the end facets, which first facet is the light beam output. The tapered region provides a sufficiently large aperture to prevent catastrophic optical mirror damage (COD) at the first end facet while reducing the amount of required astigmatism correction while the single mode confining region provides spatial filtering to maintain diffraction-limited beam at the output. This structure therefore, more readily lends itself for incorporation into existing device packages designed for linear stripe laser diodes devices. As to a second feature, a semiconductor optoelectronic device includes a gain region having a region permitting propagation of light with a diverging phase front to a first end facet of the device, which is its output, and a single mode region is coupled to an inner end of the gain region extending from the inner end to a second end facet of the device permitting propagation of light with an adiabatic phase front to the second end. The significantly smaller taper of the single mode region permits retained maintenance of single mode operation while reducing optical density of the propagating beam at the second end facet.

50 Claims, 2 Drawing Sheets

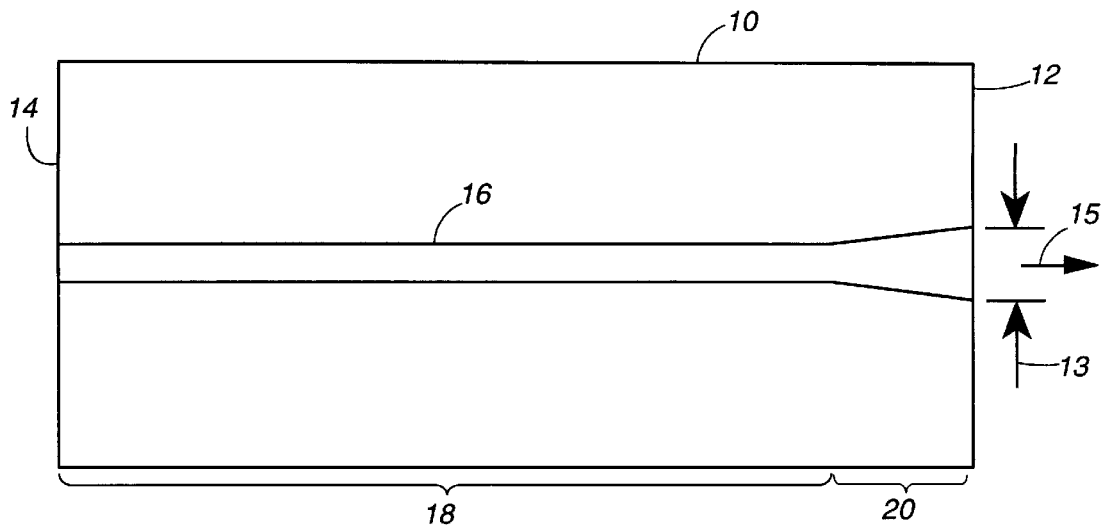
FIG._1
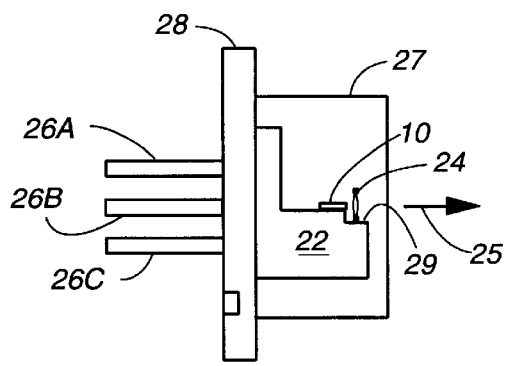
FIG._2
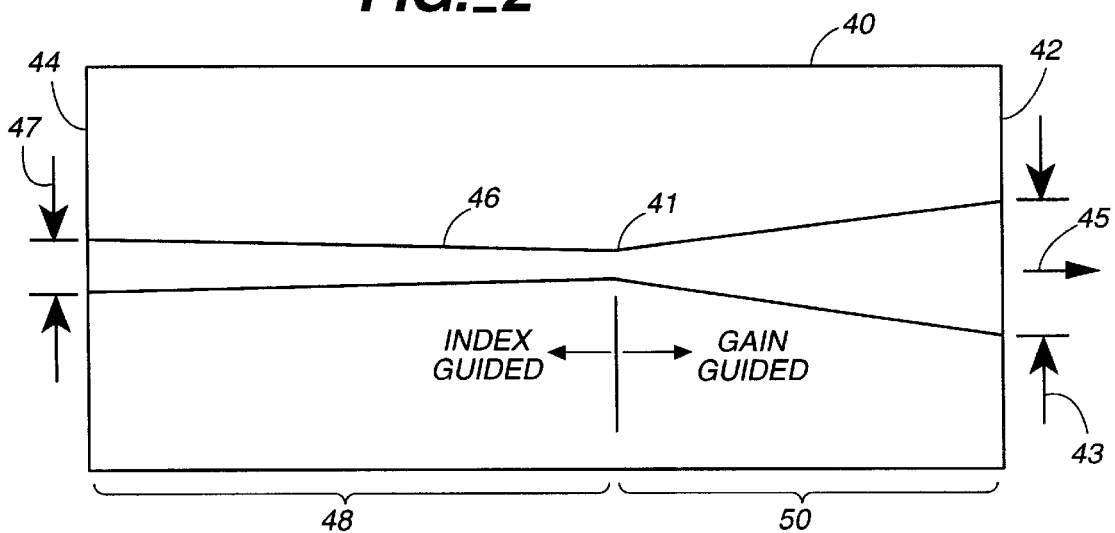
FIG._3

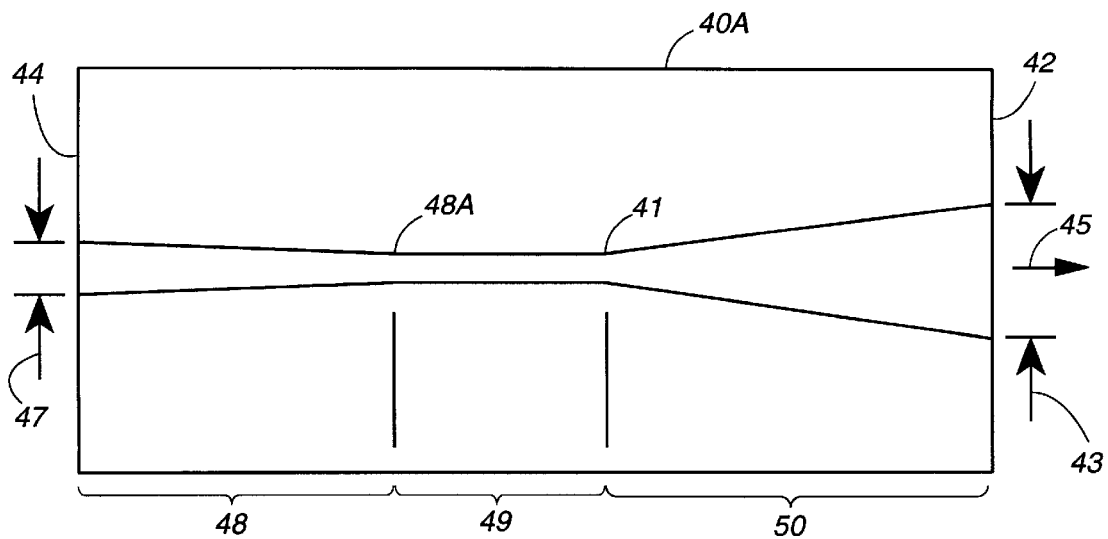
FIG._4
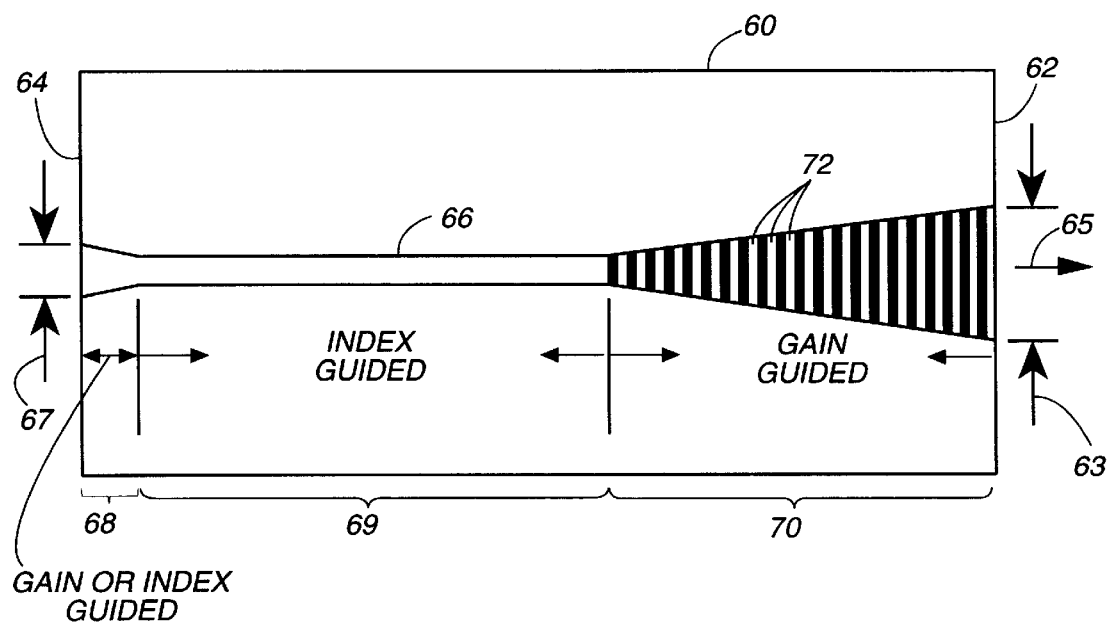
FIG._5

FLARED SEMICONDUCTOR OPTOELECTRONIC DEVICE

STATEMENT AS TO RIGHTS TO INVENTIONS MADE UNDER FEDERALLY-SPONSORED RESEARCH AND DEVELOPMENT

This invention was made with government support under Contract No. 70NANB5H1113 awarded by NIST. The government has certain rights in the invention.

FIELD OF THE INVENTION

This invention relates generally to semiconductor optoelectronic devices for producing high power low divergence beam output and, more particularly, to flared semiconductor optoelectronic devices generating light that provide a broad, high power output beam and mechanisms for controlling and dealing with the optical density at the facets of such devices.

BACKGROUND OF THE INVENTION

It is known in the art to increase the diffraction-limited power available from semiconductor optoelectronic devices to laterally taper or flare a portion of the device stripe region to the front or output facet of the device. By broadening the propagating beam through a tapered section that is electrically biased, the optical power can be increased while maintaining single mode operation of the device via the remaining portion of the stripe region which functions as a single mode filter. The single mode region may be pumped in combination with the tapered gain region forming what is termed an unstable oscillator. On the other hand, the single mode region may be fabricated to function as a laser oscillator and, as combined with the tapered gain region, forms a master oscillator power amplifier (MOPA) providing a stable resonator with an output beam that has lower divergence and much higher power levels compared to standard linear or straight stripe laser diodes. Examples of such unstable and stable resonators with tapered or flared gain regions are disclosed in U.S. Pat. Nos. 4,942,585; 5,537,432; 5,539,571; 5,392,308 and 5,592,503.

In these devices with an extended tapered gain region for propagating light amplification, the increase in optical output power is determined by the length and width of the tapered region, desired aperture width and the rate of free diffraction of the optical mode in the waveguide cavity leading to the tapered gain region. However, with an increase in output power comes the problem of catastrophic optical mirror damage (COD) particularly relative to the rear facet of such devices where the linear or straight single mode portion ends at the rear end facet of the device. Since the optical power of the device is significantly enhanced with the integrated tapered or flared gain portion of the optical waveguide cavity, COD can likely occur at the rear facet due to an increase in optical power density in such a small confined area or aperture.

Thus, it is a primary object of this invention to provide a means for maintaining the optical power density at the rear end facet of a semiconductor optoelectronic device at a level below that which leads to COD while retaining the single spatial mode filtering properties of the linear or straight single mode portion of the device.

It is also another primary object of this invention to provide a semiconductor optoelectronic device that includes at least one tapered region that is comparatively short in length compared to the total optical waveguide cavity providing at least a modest increase in optical output power above that of a standard single linear strip device having substantially the same cavity length so that the higher optical power performance device will fit into existing standard device packages designed for accommodating such standard linear stripe devices.

It is, therefore, an overall object of this invention to provide a semiconductor optoelectronic device that includes a strip pumping configuration that has one or more tapered or flared portions that improve device power output performance without COD or improve power capacity of the device, or both, without requiring additional dimensional length to the device optical cavity length so that such a modified device will fit in standard packages designed for conventional linear stripe devices.

SUMMARY OF THE INVENTION

According to one feature of this invention, a semiconductor optoelectronic device includes a resonator having an optical cavity between opposite end facets, a larger portion of a length of the resonator cavity comprising a single mode confining region for propagation of light and a substantially smaller portion of a length of the resonator cavity comprising a tapered region for permitting propagation of light with a diverging phase front to a first of the end facets, which first facet is the light beam output. The tapered region provides a sufficiently large aperture to prevent catastrophic mirror damage at the first end facet while reducing the amount of required astigmatism correction while the single mode confining region provides spatial filtering to maintain diffraction-limited beam at the output. This structure therefore, more readily lends itself for incorporation into existing device packages designed for linear stripe laser diodes devices.

According to another feature of this invention, a semiconductor optoelectronic device includes a gain region having a region permitting propagation of light with a diverging phase front to a first end facet of the device, which is its output, and a single mode region is coupled to an inner end of the gain region extending from the inner end to a second end facet of the device having a small diverging waveguide configuration permitting propagation of light with an adiabatic phase front to the second end facet. The beam cross sectional profile at the second end facet of the single mode region is significantly smaller than the beam cross sectional profile at the first end facet of the gain region and the taper of the single mode region is designed to still maintain only single mode operation without introducing multimode operation while permitting a larger aperture to provided at the second end facet reducing the optical density of the propagating beam at the second end facet and, thus, reducing the tendency for COD.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a plan view of an embodiment of a short-tapered, unstable resonator, optoelectronic device comprising this invention.

FIG. 2 is a side elevation of the optoelectronic device of FIG. 1 incorporated into a device package with a lens arrangement.

FIG. 3 is a plan view of another embodiment of an unstable resonator, optoelectronic device combining a single mode, tapered index guiding region with a flared gain guiding region.

FIG. 4 is a plan view of a modification of the embodiment shown in FIG. 4 which includes a straight single mode section between a tapered index guiding region and a slightly flared gain guiding region.

FIG. 5 is a plan view of further embodiment of an unstable resonator optoelectronic device with a flared gain guiding region that is partially pumped and a single mode, index guiding region that has a small tapered section at its facet.

DETAILED DESCRIPTION OF THE PREFERRED EMBODIMENTS OF THE INVENTION

Reference is now made to FIG. 1 illustrating a first embodiment of this invention. Optoelectronic device 10 comprises an unstable resonator, laser diode that is generally an index guided structure, but can be partially or completely index guided, which are well known in the art in laser device construction. Also, as is well known in the art, laser diode 10 is fabricated with a plurality of layers comprising Group III–V compounds or alloys, such as, GaAs/AlGaAs, InGaAs/AlGaAs, InP/InGaAsP, InGaP/AlGaInP, and GaInN/GaN the latter two of which produce light in the visible range as disclosed in U.S. patent (Ser. No. 08/650, 704, filed May 20, 1996), entitled VISIBLE WAVELENGTH, SEMICONDUCTOR OPTOELECTRONIC DEVICE WITH A HIGH POWER BROAD, SIGNIFICANTLY LATERALLY UNIFORM, DIFFRACTION LIMITED OUTPUT BEAM, which is owned by the assignee herein and incorporated herein by its reference. Device 10 includes an optical resonator 16, between end facets 12 and 14 a major portion of which comprises a linear or straight stripe 18 and a much smaller portion of which includes a short tapered section 20 at end facet 12. End facet 12 is AR coated providing a small percent feedback into cavity 16, a substantial portion of which re-enters single mode, linear waveguide portion 18. End facet 14 is of high reflected (HR) coated, e.g., 98%. Output facet 12, due to short tapered portion 20, provides an enlarged aperture 13 for output of light beam 45. The short flare portion 20 provides for a larger numerical aperture and, as a result, provides an output beam that, while still having orthogonal astigmatism, has less divergence properties in the output beam in the lateral beam direction, i.e., in the direction of the plane of the deposited layers of device 10.

Short tapered portion 20 provides a means for increasing the diffraction limited power available from device 10 by utilizing a lateral tapering configuration in the stripe leading to front end facet 12 over a taper length and width which is determined by the power requirements of the device, the desired aperture width 13, and the rate of free diffraction of the optical mode in the resonator 16 leading to tapered portion 20, i.e., linear waveguide portion 18. Thus, for given power requirements desired from device 10, the optical power density can be spread out at aperture 13 in at least a minimal manner to prevent the onset of catastrophic optical mirror damage (COD) while single mode region 18 provides spatial filtering sufficient to maintain diffraction-limited output from aperture 13. In the embodiments produced, we have preferably determined that tapered region 20 may have a cavity length within the range of approximately 20% to 50% of the total resonator cavity length 16 with an aperture 13 at end facet 12 having a lateral dimension of approximately 5 to 10 times larger than the stripe width within the single mode confining region 18. As an example, the width of the stripe in linear waveguide region 18 may generally be in the range of approximately 3 µm to 7 µm. The length of the single mode confining region 18 may be in the range of about 500 µm to about 1,000 µm, short tapered region 20 may be in the range of about 200 µm to about 500 µm, and aperture 13 may have a lateral dimension in the range of about 20 µm to about 50 µm.

In the past, flared or tapered lengths in the range of about 1,500 µm to 2,000 µm have been employed providing over 1 W of diffraction-limited power at wave-lengths within the range of 670 to 980 nm. As another example, over 400 mW of output power has been achieved at a wavelength of 635 nm from such long tapered devices which is more than five times the power obtainable from a laser diode device having single mode, linear stripe configuration for its full optical cavity length. Laser diode devices 10 with flare widths as small as about 20 µm have been fabricated, operating, for example, at a wavelength of 635 nm, providing reliable operation at power levels at least as twice as high as laser diode devices having single mode, linear stripe configuration for its full cavity length without COD at output facet 12. However, in the case of long tapered or flared gain region in these devices, they exhibit large astigmatism, require high pumping currents due to the larger stripe widths which results in more heat generation and required heatsinking for enhanced heat dissipation, and sophisticated beam correcting optics to correct for the large beam astigmatism. In certain applications, however, only a modest increase in optical power output is needed beyond that obtainable from a single mode, linear stripe laser diode device. In these cases, a significantly shorted tapered length in the stripe geometry, such as shown in FIG. 1, will suffice so that the overall cavity length of the device can be reduced which correspondingly reduces the current pumping requirements as well as heatsinking requirements to point where a such a temperature sensitive device, such as a 635 nm laser diode, can be successfully bonded in a small device package of a size designed for bonding of single mode, linear stripe laser diode devices. An example of such packages is a standard 9 mm (SOT-148) package which is schematically illustrated in FIG. 2.

Thus, a feature of this invention is the ability to utilized a higher power laser device in a container or package having a device and cavity length that matches the cavity length for lower power single linear stripe lasers and, therefore, can fit within the same size package but provide for higher output power levels.

Although the astigmatism in the short tapered laser diode device 10 of this invention is significantly reduced, astigmatism correction is still required so that a microlens may be mounted on the heatsink with the device in close proximity to its output facet. A device 10 within the cavity and aperture dimensional ranges, mentioned above, will typically exhibit astigmatism in the range of approximately 60 µm to approximately 160 µm, depending on the length of tapered region 20, i.e., the virtual source within the tapered region may exist approximately 60 µm to approximately 160 µm back from front end facet 12. As shown in FIG. 2, laser diode device 10 is mounted on a heatsink submount 22 in an enclosure or container 27 sealed to base package 28. The device package, as previously mentioned, may be 9 mm, type SOT-148 package and have three output terminals 26A–26C, two for biasing device 10 and, optionally, the third for a photodiode (not shown) positioned in container 27 for monitoring output from back end facet 14. A lens system in the form of microlens 24 is mounted in a formed instep 29 in heatsink submount 22 which may be mounted with epoxy or solder to bond the lens to the heatsink submount 22 as low-cost assembly step with instep 29 facilitating alignment of the lens with the device 10 output. Lens 24, however, may be aligned with device 10 output without the use of instep 29. Ideally, lens 24 is designed as an aspheric cylindrical lens to obtain high throughput and high beam circularization with substantially aberration-free output. Thus, with proper choice of the focal length and NA of lens 24, a substantially circular, stigmatic beam output 25 can be achieved. The back surface of lens 24 may also be AR coated to avoid feedback and to improve lens throughput. Lens 24 may be a homogeneous fiber microlens, a D-shaped cylinder lens, a graded-index (GRIN) lens, or an aspheric cylindrical lens.

Reference is now made to FIG. 3 illustrating another embodiment of this invention comprising semiconductor optoelectronic device 40, being an unstable resonator, laser diode having a contact stripe and cavity 46 comprising two different regions. One region is a single mode confining region 48 having a slight taper with the taper extending from internal aperture 41 to end facet 44 and a tapered region 50 with a larger taper extending from internal aperture 41 to front end facet 42. To be noted is that the taper of region 50 is much larger than the taper of region 48, these two different tapers formed in the stripe configuration performing different functions. Moreover, as a result, aperture 47 at rear facet 44 is much smaller than aperture 43 at front facet 42. A further important aspect of this structure is that region 48 is formed as a lateral index guide and region 50 is formed as a lateral gain guide, both such guiding mechanisms being well known in the art and an example of which is illustrated in FIGS. 1–3 of incorporated U.S. patent (Ser. No. 08/650,704, filed May 20, 1996).

To maintain lowest order spatial mode operation in device 40, index-guided region 48 must have narrow strip widths, such as stripe widths in the range of approximately 2 $\mu$m to approximately 4 $\mu$m. In such a case, the optical power density at rear end facet 44, which is an HR-coated facet, may become extremely high resulting in catastrophic optical mirror damage (COD) destroying the laser device. This COD problem is exacerbated as the wavelength of operation becomes shorter, such as in the case of laser devices disclosed in incorporated U.S. patent (Ser. No. 08/650,704, filed May 20, 1996) which emit light in the visible red, due to higher optical absorption in the laser device material at aperture 47 in end facet 44. To circumvent these problems, index guided region 48 is provided with a slight taper so as to spread out the optical density of the light presented at aperture 47 over a larger aperture area compared to the case where such a taper was not present in stripe configuration 46. The flare-out of stripe 46 at end facet 44 provides for a larger area for optical absorption, increasing the power level that can be imposed at aperture 47 while suppressing the possibility of the occurrence of COD. As a result, COD is avoided over the operating range of device 40 while the active pumping area in the portion of stripe 46 comprising region 48 is increased providing for a larger current pumping density. In case of longer wavelength operation, such as 980 nm output for telecommunication applications, the area increase of the slight taper, albeit small, provides a comparatively larger current pumping area along that portion of stripe 14 lying in region 48 so that more optical power may be produced in output beam 45. Since the taper in region 48 is so slight, the phase front of the propagating light is relative flat, i.e. adiabatic, so that there is no significant divergence properties such that the divergence of the propagating beam at rear facet 44 is much the same as that at internal aperture 41.

As indicated above, the taper angle in index guided region 48 is very small, being of an angle that is much less than region 50 in order to avoid the onset of lasing in device 40 of higher order spatial modes. As an example, the width of stripe 16 in region 48 need only be tapered a few microns over several hundred microns of length of region 48. As a result, the flare angle may be less than 1°. As a further example, the stripe width at internal aperture 41 may be in the range of 2 $\mu$m to 4 $\mu$m while the lateral width of aperture 47 may be around 6 $\mu$m to 8 $\mu$m with a region 48 length in the range of about 500 $\mu$m to about 1,000 $\mu$m. This type of slight taper is referred to as adiabatic in that its taper angle is very small such that the optical mode propagates with essentially no loss along the index waveguide of region 48. The taper of gain guided portion 50 may extend from internal aperture of several microns to output aperture that is several tens to hundreds of microns. A specific example is an internal aperture 41 width of about 3 $\mu$m extending along a region length to provide a 6° taper that provides an output aperture 43 having a width of about 20 $\mu$m. The taper angle in region 50 may be in the range of about 2° to about 15° depending upon the rate of free diffraction of the optical mode in region 48.

The embodiment shown in FIG. 4 is the same as shown in FIG. 3 except that unstable resonator, laser diode device 40A includes a centrally located straight stripe, index guided portion 49 between internal aperture 41 and narrower end 48A of tapered index guided region 48. The straight portion 49 between slight tapered region 48 and larger tapered portion 50 provides for good single mode spatial filtering enhancing assurance that the onset of multimode operation in index guided region 48 will not likely occur.

Reference is now made to the embodiment shown in FIG. 5 illustrating a further embodiment of this invention. Semiconductor optoelectronic device 60 comprises an unstable resonator, laser diode having a stripe region 66 between end facets 62 and 64 comprising an optical cavity with three distinct cavity regions 68, 69 and 70. Single mode containing or filtering region 69 is an index guided region formed as is well known in the art, one such approach shown in FIGS. 1–3 of U.S. patent (Ser. No. 08/650,704, filed May 20, 1996). Rear facet 64 is highly reflective (HR) coated and front facet 62 is antireflective (AR) coated providing a small amount of optical feedback into the cavity. Between region 69 and rear facet 64 is a comparatively very short tapered region 68 forming an aperture 67 at facet 64 that is significantly larger than would be the case if the pumping stripe in region 69 had extended to facet 64. Region 68 may be either formed as index guided or a gain guided region in a manner known in the art and as illustrated for the index and gain guided regions in the structure of U.S. patent (Ser. No. 08/650,704, filed May 20, 1996). With the length of tapered region 68 being significantly smaller compared to the length of single mode region 69, the taper angle in region 68 may be significantly larger than the taper angle in region 48 of the embodiment in FIG. 3. Also, in the case where region 68 is gain guided, its length must be sufficiently long to provide the opportunity for the occurrence of light divergence which length is generally about two times greater than the Rayleigh range. As an example, for a 635 nm wavelength device, with an index guide region 66 having a mode (stripe) width of 4 $\mu$m, the length of gain guide region is about 200 $\mu$m. This has the important advantage of providing a larger optical density spread at aperture 67 compared to that of the FIG. 3 embodiment while assurance of maintained single mode filtering is accomplished via the larger linear stripe region 69. Thus, tapered region 68 performs the same function as in the previous embodiment to spread out the optical density of the light presented at aperture 67 over a larger aperture area for a larger area provided for optical absorption, particularly in the case of shorter more absorptive wavelengths, increasing the power level that can be imposed at aperture 67 while suppressing the occurrence of COD. Such a shorter wavelength device is illustrated in U.S. patent (Ser. No. 08/650,704, filed May 20, 1996).

Between region 69 and output facet 62 is a tapered region 50 that includes a patterned pumping stripe 72 through its entire length for the purpose of permitting the propagating light to expand in region 70 to output aperture 63 but without receiving significant gain from pumping via stripe pattern 72. Region 70 is gain guided as illustrated per the approach shown in the comparable region of the laser diode structure illustrated in U.S. patent (Ser. No. 08/650,704, filed May 20, 1996). The patterned pumping in device 60 is shown as linear transverse spaced stripes but other pumping patterns may be utilized, as illustrated in U.S. patent (Ser. No. 08/650,704, filed May 20, 1996) in FIGS. 10A–10E. It should be noted that a major difference between the stripe geometries illustrated in that patent and in the case here is that the patterns in the patent extend only for a short portion of the length of the gain guided region whereas, in the case here, the pattern extends for the full length of flared gain region 70 for a different purpose of permitting the propagating beam to expand to output aperture 3 with the original beam power maintained or possibly increased only a small amount.

As an example of specific ranges for the lengths of regions 68–70, region 68 may have a length in the range of about 10 $\mu$m to about 100 $\mu$m, region 69 may have a length in the range of about 500 $\mu$m to about 1,000 $\mu$m, and region 70 may have a length in the range of about 200 $\mu$m to about 2,000 $\mu$m. The taper angle of region 68 may be in the range of about 1° to about 5°. The taper angle of region 70 may be the same as in the case of the previous embodiment.

Any of the foregoing embodiments utilizing one or more tapered or flared regions may be comprised of GaInN/GaN on a substrate comprising sapphire, SiC, Si, or the like. In particular, the blue light emitting resonator device may comprise an GaInN active region or a multiple quantum well active region of GaInN wells and GaN barriers. The active region is confined by cladding layers of p-GaN and N-GaN. The p-type impurities may be Zn, Cd, Be, Mg, Ca, and Ba. The n-type impurity may be Si.

Although the invention has been described in conjunction with one or more preferred embodiments, it will be apparent to those skilled in the art that other alternatives, variations and modifications will be apparent in light of the foregoing description as being within the spirit and scope of the invention. As an important example, the foregoing embodiments have been discussed relative to an unstable resonator device. However, the features of this invention are also applicable to other flared devices, including, for example, stable resonators, flared amplifiers, external cavity lasers, or MOPA's. Thus, the invention described herein is intended to embrace all such alternatives, variations and modifications as that are within the spirit and scope of the following claims.

What is claimed is:

1. A semiconductor optoelectronic device comprising:
   a gain region having a region permitting propagation of light with a diverging phase front to a first aperture at a first end facet of the device;
   a single mode region coupled to an inner end of said gain region;
   said single mode region extending from the inner end to a second end facet of the device with a small diverging taper permitting propagation of light with a substantially adiabatic phase front to a second aperture at the second end facet so that the propagating light phase front at the second end facet is substantially the same as that at the inner end;
   the beam cross sectional profile at the second end facet of the single mode region being significantly smaller than the beam cross sectional profile at the first end facet of the gain region to limit the single mode region to supporting only single mode operation while reducing optical density of the propagating beam at the second end facet.

2. The semiconductor optoelectronic device of claim 1 wherein said gain region is patterned pumped so that the gain of propagating light is minimally maintained while permitting the light to diverge to said first end facet.

3. The semiconductor optoelectronic device of claim 2 wherein said pattern pumping comprises a pattern of pumping stripes.

4. The semiconductor optoelectronic device of claim 1 wherein said gain region comprises gain guided region and said diverging single mode region comprises an index guided or a gain guided region.

5. The semiconductor optoelectronic device of claim 1 wherein the angle of divergence of said gain region is in the range of about 3° to about 7° and the angle of divergence of said single mode region is 1° or less.

6. The semiconductor optoelectronic device of claim 1 further comprising:
   a portion of said single mode region comprising a straight region having parallel edges;
   said single mode region limited to a region adjacent to the second end so that said single mode region is both substantially smaller in length and angle of divergence compared to said diverging phase front region.

7. The semiconductor optoelectronic device of claim 6 wherein the length of said single mode region is in the range of about 0.5% to about 5% of the length of said diverging gain region.

8. The semiconductor optoelectronic device of claim 6 wherein said single mode region comprises an index guided or a gain guided region and said diverging gain region comprises a gain guided region.

9. The semiconductor optoelectronic device of claim 1 further comprising a lens system at the first end to receive light output from the first end.

10. The semiconductor optoelectronic device of claim 9 wherein said lens system comprises a cylindrical lens.

11. The semiconductor optoelectronic device of claim 9 wherein said lens system comprises an aspheric cylindrical lens.

12. The semiconductor optoelectronic device of claim 9 wherein said lens system comprises a graded-index lens or a homogenous fiber lens.

13. The semiconductor optoelectronic device of claim 1 wherein said device is formed at least partially from GaN or GaInN.

14. A semiconductor optoelectronic device comprising:
    a gain region having a region permitting propagation of light with a diverging phase front to a first end facet of the device;
    a single mode region coupled to an inner end of said gain region;
    said single mode region extending from said inner end to a second end facet of the device with a monotonically broadening waveguide width to said second end facet but sufficiently small in length to maintain propagation of light with a substantially adiabatic phase front along said single mode region to the second end facet so that no significant beam divergence is encountered in said single mode region supporting only single mode propagation while providing optical density reduction of the propagating light at the second end facet; and a straight region having parallel edges coupled between said gain region and said single mode region.

15. The semiconductor optoelectronic device of claim 14 wherein said single mode region limited to a region adjacent to the second end facet having a length substantially smaller than either of said straight and gain regions.

16. The semiconductor optoelectronic device of claim 14 wherein an angle of divergence of said single mode region is about 1° or less.

17. The semiconductor optoelectronic device of claim 14 wherein the length of said single mode region is in the range of about 0.5% to about 5% of the length of said gain region.

18. The semiconductor optoelectronic device of claim 14 wherein said single mode region comprises an index guided or a gain guided region and said diverging gain region comprises a gain guided region.

19. The semiconductor optoelectronic device of claim 14 further comprising a lens system at the first end to receive light output from the first end.

20. The semiconductor optoelectronic device of claim 19 wherein said lens system comprises a cylindrical lens.

21. The semiconductor optoelectronic device of claim 19 wherein said lens system comprises an aspheric cylindrical lens.

22. The semiconductor optoelectronic device of claim 19 wherein said lens system comprises a graded-index lens or a homogenous fiber lens.

23. The semiconductor optoelectronic device of claim 14 wherein said device is formed at least partially from GaN or GaInN.

24. A semiconductor optoelectronic device comprising:
a gain region having a region for permitting propagation of light with a diverging phase front to a first facet end;
a single mode region coupled to one end of said gain region;
said single mode region extending from said one end to a second end facet of the device and characterized by a tapered configuration having its smallest dimension at said one end and extending to said second end facet wherein the angle of tapered configuration relative to the direction of propagating light is maintained at an angle which provides a sufficiently large lateral dimension at said second end facet so as to decrease optical density to prevent catastrophic damage at higher power levels but is sufficiently narrow along its length to maintain the propagating light with a substantially adiabatic phase front as it propagates through the single mode region from the one end to the second end facet.

25. The semiconductor optoelectronic device of claim 24 wherein a portion of said single mode region adjacent said one end including a section having substantially parallel edges forming a straight section in said single mode region between said tapered single mode region and said diverging gain region.

26. The semiconductor optoelectronic device of claim 24 wherein said tapered configuration of said single mode region has a taper angle of about 1° or less.

27. The semiconductor optoelectronic device of claim 24 wherein said single mode region comprises an index or gain guided region and said diverging gain region comprises a gain guided region.

28. The semiconductor optoelectronic device of claim 24 wherein the length of said tapered single mode region is in the range of about 0.5% to about 5% of the length of said diverging gain region.

29. The semiconductor optoelectronic device of claim 24 further comprising a pump pattern for partial pumping of said diverging gain region.

30. The semiconductor optoelectronic device of claim 24 further comprising a lens system at said first facet to receive light output from said first facet.

31. The semiconductor optoelectronic device of claim 30 wherein said lens system comprises a cylindrical lens.

32. The semiconductor optoelectronic device of claim 30 wherein said lens system comprises an aspheric cylindrical lens.

33. The semiconductor optoelectronic device of claim 30 wherein said lens system comprises a graded-index lens or a homogenous fiber lens.

34. The semiconductor optoelectronic device of claim 24 wherein said device is formed at least partially from GaN or GaInN.

35. A semiconductor optoelectronic device comprising:
a resonator having an optical cavity between opposite end facets, a larger portion of a length of the resonator cavity comprising a single mode confining region for propagation of light and a smaller portion of a length of the resonator cavity comprising a tapered region for permitting propagation of light with an adiabatic phase front to a first of the end facets comprising the light beam output;
the tapered region comprising a cavity length within the range of approximately 20% to 50% of the total resonator cavity length with an aperture at the first end facet of approximately 10% to 30% larger than the stripe width within the single mode confining region;
said tapered region to provide a sufficiently large aperture to prevent catastrophic optical mirror damage at the first end facet while the single mode confining region provides spatial filtering to maintain diffraction-limited beam at the output.

36. The semiconductor optoelectronic device of claim 35 wherein the single mode confining region contains a tapered configuration having its smallest dimension at the coupling region with the tapered region and extending to a second of the end facets with the angle of tapered configuration relative to the direction of propagating light is maintained at an angle which provides a sufficiently large lateral dimension at the second end facet so as to decrease optical density to prevent catastrophic damage at higher power levels but is sufficiently narrow along its length to prevent multimode propagation therein.

37. The semiconductor optoelectronic device of claim 35 further comprising a lens system at the first end facet to receive light output from the first end facet.

38. The semiconductor optoelectronic device of claim 37 wherein the lens system comprises a cylindrical lens.

39. The semiconductor optoelectronic device of claim 37 wherein the lens system comprises an aspheric cylindrical lens.

40. The semiconductor optoelectronic device of claim 37 wherein the lens system comprises a graded-index lens or a homogenous fiber lens.

41. The semiconductor optoelectronic device of claim 37 wherein the lens system is mounted in a device package with the device and lens system on same heatsink.

42. The semiconductor optoelectronic device of claim 35 further comprising a pump pattern for partial pumping of said diverging gain region.

43. The semiconductor optoelectronic device of claim 35 wherein said device is formed at least partially from GaN or GaInN.

44. A semiconductor optoelectronic device comprising:

a resonator having an optical cavity between opposite end facets, a larger portion of a length of the optical cavity comprising a linear, single mode confining region for propagation of light and a smaller portion of a length of the optical cavity comprising a tapered region for permitting propagation of light with a diverging phase front to a first of the end facets comprising the light beam output having astigmatic properties wherein a virtual focal point of a lateral extent of the beam is within the device cavity, the cavity length of the smaller portion of the optical cavity approximately 20% to 50% of the total optical cavity length;

said smaller tapered region having an output aperture at said first end facet in a range of approximately 5 to 10 times larger than the width of said linear, single mode confining region to provide an increase in optical output power with a virtual focal point for said smaller tapered region that is closer to the first end facet such that said device together with output optics will fit within a standard device package designed for a device having a totally linear optical cavity.

45. The semiconductor optoelectronic device of claim 44 wherein said output optics comprises a lens system at the first end facet to receive light output from the first end facet.

46. The semiconductor optoelectronic device of claim 45 wherein the lens system comprises a cylindrical lens.

47. The semiconductor optoelectronic device of claim 45 wherein the lens system comprises an aspheric cylindrical lens.

48. The semiconductor optoelectronic device of claim 45 wherein the lens system comprises a graded-index lens or a homogenous fiber lens.

49. The semiconductor optoelectronic device of claim 45 wherein the lens system is mounted in a device package with the device and lens system on same heatsink.

50. The semiconductor optoelectronic device of claim 44 wherein said device is formed at least partially from GaN or GaInN.

* * * * *